United States Patent
Tan et al.

(10) Patent No.: US 10,386,875 B2
(45) Date of Patent: Aug. 20, 2019

(54) BANDGAP REFERENCE CIRCUIT AND SENSOR CHIP USING THE SAME

(71) Applicant: PixArt Imaging Inc., Hsin-Chu County (TW)

(72) Inventors: Kok-Siang Tan, Penang (MY); Wai-Lian Teo, Penang (MY)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

(21) Appl. No.: 15/726,863

(22) Filed: Oct. 6, 2017

(65) Prior Publication Data

US 2018/0314282 A1 Nov. 1, 2018

Related U.S. Application Data

(63) Continuation-in-part of application No. 15/499,497, filed on Apr. 27, 2017, now Pat. No. 9,977,442.

(51) Int. Cl.
| | |
|---|---|
| *G05F 1/565* | (2006.01) |
| *H03G 1/00* | (2006.01) |
| *G05F 1/10* | (2006.01) |
| *G05F 3/30* | (2006.01) |
| *G05F 1/46* | (2006.01) |

(52) U.S. Cl.
CPC ............ *G05F 1/565* (2013.01); *G05F 1/10* (2013.01); *G05F 1/468* (2013.01); *G05F 3/30* (2013.01); *H03G 1/0082* (2013.01); *H03G 1/0052* (2013.01)

(58) Field of Classification Search
CPC . G05F 1/46; G05F 1/461; G05F 1/463; G05F 1/465; G05F 1/565; G05F 1/59; G05F 3/3222; G05F 3/225; G05F 3/245; G05F 3/30
See application file for complete search history.

(56) References Cited

U.S. PATENT DOCUMENTS

| | | | | | |
|---|---|---|---|---|---|
| 5,132,565 | A | * | 7/1992 | Kuzumoto | G05F 1/465 326/34 |
| 5,280,455 | A | * | 1/1994 | Kanaishi | G11C 5/147 307/64 |
| 5,359,722 | A | * | 10/1994 | Chan | G11C 7/22 365/203 |
| 5,442,277 | A | * | 8/1995 | Mori | G05F 1/465 323/312 |
| 6,333,669 | B1 | * | 12/2001 | Kobayashi | G05F 1/465 327/102 |
| 6,867,641 | B2 | * | 3/2005 | Kang | G05F 1/465 327/538 |
| 7,319,361 | B2 | * | 1/2008 | Jin | G05F 1/465 327/530 |
| 7,466,115 | B2 | * | 12/2008 | Biagi | H03F 1/02 323/273 |

(Continued)

*Primary Examiner* — Thomas J. Hiltunen
(74) *Attorney, Agent, or Firm* — Hauptman Ham, LLP

(57) ABSTRACT

A bandgap reference circuit including a clamp circuit is provided. The bandgap reference circuit performs the calibration only for one time in a normal mode to store a control code of a reference generator of the clamp circuit. In a suspend mode, the control code is used for controlling the reference generator to cause the clamp circuit to provide a desired source voltage, and a bandgap reference voltage source is shut down to reduce the power consumption.

17 Claims, 8 Drawing Sheets

(56) References Cited

U.S. PATENT DOCUMENTS

| | | | | |
|---|---|---|---|---|
| 8,125,800 | B2* | 2/2012 | Forghani-zadeh | ............................ H02M 3/33523 323/287 |
| 8,330,532 | B2* | 12/2012 | Nikolov | ................... G05F 3/20 323/280 |
| 8,513,938 | B2* | 8/2013 | Tachibana | ................ G05F 3/30 323/314 |
| 9,190,988 | B1* | 11/2015 | Gupta | .................... H03K 17/22 |
| 9,804,615 | B2* | 10/2017 | Chern | ..................... G05F 1/468 |
| 2003/0007296 | A1* | 1/2003 | Tomishima | ............ G11C 5/147 361/18 |
| 2004/0155636 | A1* | 8/2004 | Fukui | ....................... G05F 1/56 323/281 |
| 2006/0017496 | A1* | 1/2006 | Yamada | ................. G05F 1/465 327/540 |
| 2008/0136382 | A1* | 6/2008 | Chellamuthu | .......... G05F 1/468 323/234 |
| 2008/0191790 | A1* | 8/2008 | Brox | ...................... G05F 1/465 327/540 |
| 2013/0147271 | A1* | 6/2013 | Yotsuji | ..................... H02J 4/00 307/28 |
| 2016/0103459 | A1* | 4/2016 | Chern | .................... G05F 1/468 323/313 |

* cited by examiner

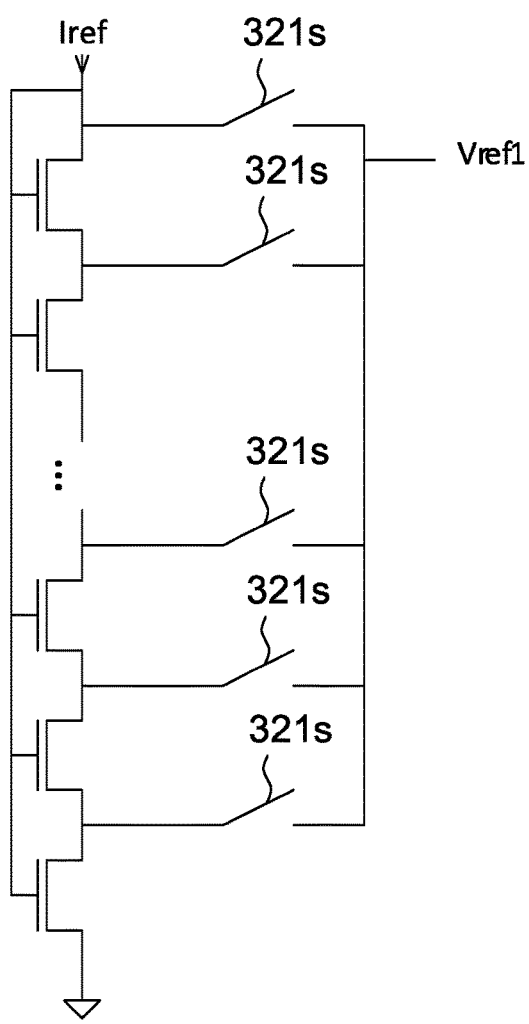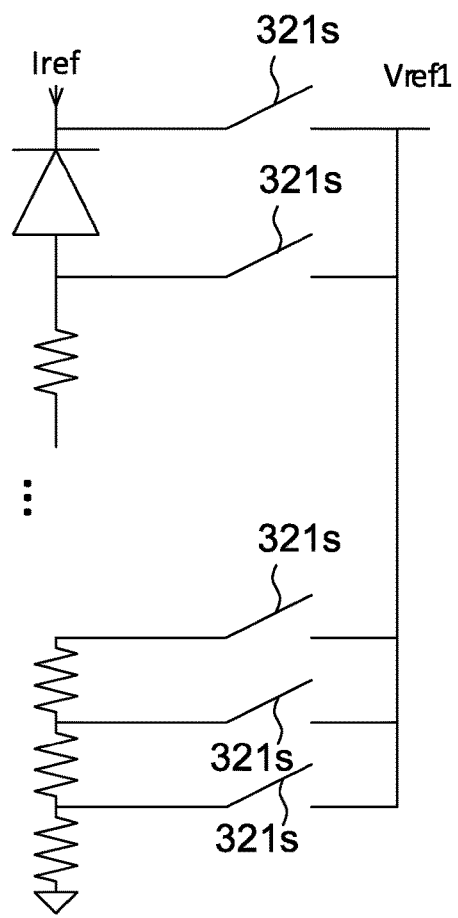
FIG. 6A                    FIG. 6B

| | clamp circuit | SW1 | calibration engine | regulator | bandgap ref. voltage source |
|---|---|---|---|---|---|
| normal | shut down | OFF | idle | turn on | turn on |
| calibration (from normal) | turn on | OFF | activated store (control) code | turn on | turn on |
| low power | turn on | conducted | activated | shut down | shut down |
FIG. 9
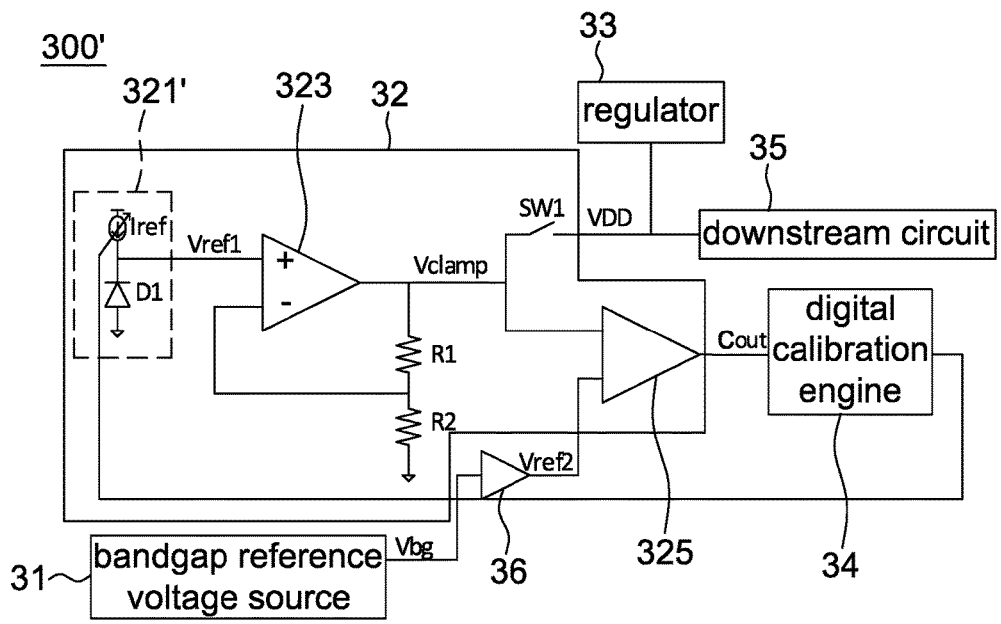
FIG. 10
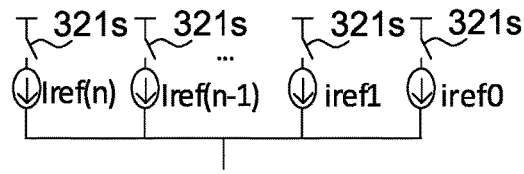
FIG. 11

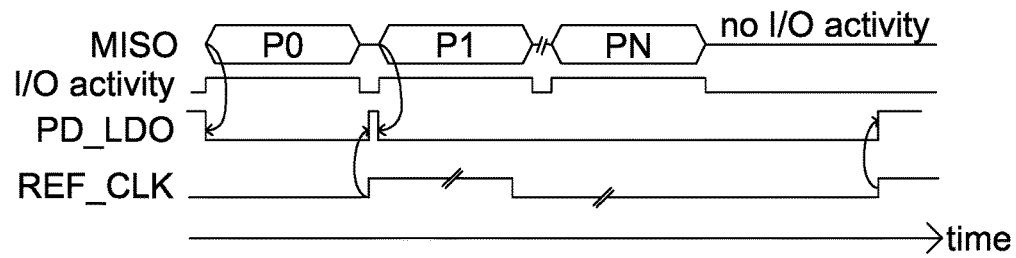
FIG. 18
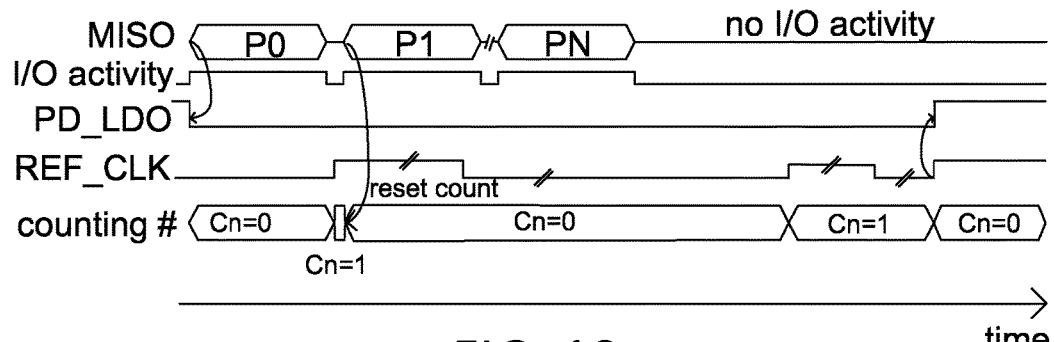
FIG. 19
| | 1301 | 1303 | MUX | 1321 | 1302 |
|---|---|---|---|---|---|
| normal mode | ON | ON | node 0 | OFF | OFF |
| suspend mode | OFF | OFF | node 1 | ON | ON |
| LDO mode | OFF | ON | node 1 | ON | ON/OFF |
FIG. 20

BANDGAP REFERENCE CIRCUIT AND SENSOR CHIP USING THE SAME

RELATED APPLICATIONS

The present application is a continuation-in-part application of U.S. patent application Ser. No. 15/499,497 filed on Apr. 27, 2017, the disclosure of which is hereby incorporated by reference herein in its entirety.

BACKGROUND

1. Field of the Disclosure

This disclosure generally relates to a bandgap reference circuit and, more particularly, to a bandgap reference circuit and a sensing chip using the same that shuts down the bandgap reference voltage source thereof and provides a source voltage only by a clamp circuit in a suspend mode.

2. Description of the Related Art

FIG. 1 is a conventional power source circuit for providing a source voltage $V_{DD}$ required by a downstream circuit 15. The power source circuit includes a bandgap reference voltage source 11 and a regulator 13. The bandgap reference voltage source 11 provides a stable reference voltage Vref to the regulator 13. The regulator 13 has low static current Iddq to reduce the power consumption and is used to hold the source voltage $V_{DD}$. However, in a lower power mode, the regulator 13 still requires the power continuously provided by the bandgap reference voltage source 11 to generate the source voltage $V_{DD}$, such that significant power is still consumed in the low power mode. When this kind of power source circuit is applied to portable electronic devices, the standby time of the portable electronic devices is shortened.

FIG. 2 is another conventional power source circuit. Compared with the one shown in FIG. 1, the power source circuit in FIG. 2 further includes an operational amplifier 22 in addition to a bandgap reference voltage source 21 and a regulator 23. The operational amplifier 22 is used as a clamp circuit and to hold the source voltage $V_{DD}$ in a low power mode. In FIG. 2, although the operational amplifier 22 has low static current Iddq and the regulator 23 can be deactivated in the low power mode, the bandgap reference voltage source 21 still continuously operates in the low power mode.

In addition, in addition to having low static current Iddq (e.g., nano ampere range), the clamp circuit of a bandgap reference circuit has to fulfill the requirements of holding a stable source voltage, a small circuit area and working in an allowable voltage range.

Preferably, the clamp circuit of a bandgap reference circuit does not draw any power from a bandgap reference voltage source in the low power mode. However, it is not easy to achieve this purpose because when the bandgap reference voltage source for providing an accurate reference voltage Vref is shut down and if the reference voltage Vref has a 10% voltage variation, the source voltage $V_{DD}$ provided by the clamp circuit may change more than 10% to exceed the allowable working voltage range.

SUMMARY

One object of the present disclosure is to provide a bandgap reference circuit and an operation method thereof that perform the calibration in the normal mode.

To achieve the above object, the present disclosure provides a bandgap reference circuit including a bandgap reference voltage source, a clamp circuit and a digital calibration engine. The bandgap reference voltage source is configured to provide a bandgap voltage. The clamp circuit includes a reference generator, an operational amplifier, a comparator and an output switch. The reference generator is configured to generate a first reference voltage. The operational amplifier has a positive input terminal, a negative input terminal and an output terminal, wherein the positive input terminal is configured to receive the first reference voltage, and the output terminal is feedback to the negative input terminal via a feedback resistor and configured to output a clamp voltage. The comparator is configured to compare the clamp voltage with a second reference voltage to generate a comparing output, wherein the second reference voltage is associated with the bandgap voltage. The output switch is connected to the output terminal of the operational amplifier and configured to control the outputting of the clamp voltage. The digital calibration engine is configured to adjust, according to the comparing output, the first reference voltage generated by the reference generator to obtain a smallest difference between the clamp voltage and the second reference voltage.

The present disclosure further provides a bandgap reference circuit including a bandgap reference voltage source, a clamp circuit and a digital calibration engine. The bandgap reference voltage source is configured to provide a bandgap voltage. The clamp circuit includes a reference generator, an operational amplifier, a comparator and an output switch. The reference generator is configured to generate a first reference voltage. The operational amplifier has a positive input terminal, a negative input terminal and an output terminal, wherein the positive input terminal is configured to receive the first reference voltage, and the output terminal is feedback to the negative input terminal via a feedback resistor and configured to output a clamp voltage. The comparator is configured to compare the first reference voltage with a second reference voltage to generate a comparing output, wherein the second reference voltage is associated with the bandgap voltage. The output switch is connected to the output terminal of the operational amplifier and configured to control the outputting of the clamp voltage. The digital calibration engine is configured to adjust, according to the comparing output, the first reference voltage generated by the reference generator to obtain a smallest difference between the first reference voltage and the second reference voltage.

The present disclosure further provides an operating method of a bandgap reference circuit. The bandgap reference circuit includes a clamp circuit, a bandgap reference voltage source and a digital calibration engine. The clamp circuit includes a plurality of clamp switches for controlling a clamp voltage outputted thereby. The operating method includes the steps of: entering a normal mode, in which the clamp circuit is shut down and the digital calibration engine is idle; entering a calibration mode, in which the clamp circuit and the digital calibration engine are activated, and the plurality of clamp switches are arranged as a predetermined conducting state; in the calibration mode, adjusting, using the digital calibration engine, a conducting state of the plurality of clamp switches to obtain a smallest difference between the clamp voltage and a predetermined source voltage, and storing, in the digital calibration engine, a control code of the plurality of clamp switches corresponding to the smallest difference; and deactivating the clamp circuit and idling the digital calibration engine to return to the normal mode.

The present disclosure further provides a sensor chip including a reference generator, a clamp circuit, a regulator, a multiplexer and a digital core. The reference generator is configured to provide a reference voltage. The clamp circuit is electrically coupled to the reference generator, and configured to receive the reference voltage and hold a source voltage. The multiplexer is electrically coupled between the reference generator and the regulator. The digital core is configured to control the regulator and the multiplexer. In a suspend mode, the digital core is configured to control the multiplexer to connect the reference voltage to the regulator, and the regulator is powered off. An LDO mode is entered when the digital core receives a rising edge or a falling edge of an external clock signal under the suspend mode. In the suspend mode, the digital core is configured to power on the regulator to provide the source voltage.

The present disclosure further provides a sensor chip including a reference generator, a bandgap reference voltage source, a regulator and a switching element. The reference generator is configured to provide a reference voltage. The bandgap reference voltage source is configured to provide a bandgap voltage. The regulator is configured to provide a source voltage. The switching element is coupled between the reference generator, the bandgap reference voltage source and the regulator. In a normal mode, the switching element is configured to connect the bandgap voltage to the regulator to generate the source voltage. In a suspend mode, the switching element is configured to connect the reference voltage to the regulator.

In the bandgap reference circuit of the present disclosure, diodes formed by the diode connected transistor are used as resistors to reduce an occupied area by the circuit. Although this kind of diodes is still influenced by the manufacturing process, the process variation is diminished after the calibration.

In the bandgap reference circuit of the present disclosure, as the bandgap reference voltage source and the regulator are shut down in the low power mode or suspend mode, the power consumption of the circuit is significantly reduced.

In the bandgap reference circuit of the present disclosure, as the comparator is used for once in the calibration mode and not used for comparison during most of the time, the comparator is sharable with other circuit functions to effectively utilize the circuit component.

In the bandgap reference circuit of the present disclosure, a source voltage is more accurately set and has a lower voltage variation in a suspend mode, the source voltage can be arranged at a lower level, e.g., 1 volt rather than 1.5 volts, to reduce the leakage current in the suspend mode.

In the bandgap reference circuit of the present disclosure, the calibration on the source voltage provided by the clamp circuit is automatically accomplished in the normal mode, and thus the wafer or chip level trimming is no longer required to effectively reduce the cost of testing and production.

The bandgap reference circuit of the present disclosure is preferably adapted to portable electronic devices that need to reduce the power consumption as much as possible, such as the cellphone, tablet computer and wireless mouse.

BRIEF DESCRIPTION OF THE DRAWINGS

Other objects, advantages, and novel features of the present disclosure will become more apparent from the following detailed description when taken in conjunction with the accompanying drawings.

FIG. 6A is a partial circuit diagram of a reference generator of a clamp circuit according to an alternative embodiment of the present disclosure.

FIG. 6B is an equivalent circuit of FIG. 6A.

FIG. 9 is the operating state of an operating method of a bandgap reference circuit according to one embodiment of the present disclosure.

FIG. 10 is a block diagram of a bandgap reference circuit according to an alternative embodiment of the present disclosure.

FIG. 11 is a current source bank of a reference generator of a clamp circuit according to one embodiment of the present disclosure.

FIG. 18 is an alternative schematic diagram of turning ON/OFF a regulator according to the I/O activity and reference clock signal in the embodiment of the present disclosure.

FIG. 19 is a schematic diagram of turning ON/OFF a regulator according to the I/O activity, reference clock signal and counting number in the embodiment of the present disclosure.

FIG. 20 is the operating state of a bandgap reference circuit according to another embodiment of the present disclosure.

DETAILED DESCRIPTION OF THE EMBODIMENT

It should be noted that, wherever possible, the same reference numbers will be used throughout the drawings to refer to the same or like parts.

Figure 1:
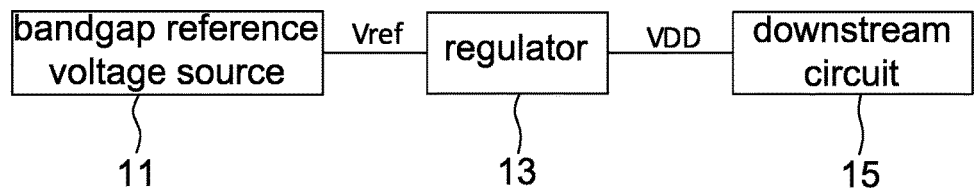
FIG. 1 is a block diagram of a conventional power source circuit.
Figure 2:
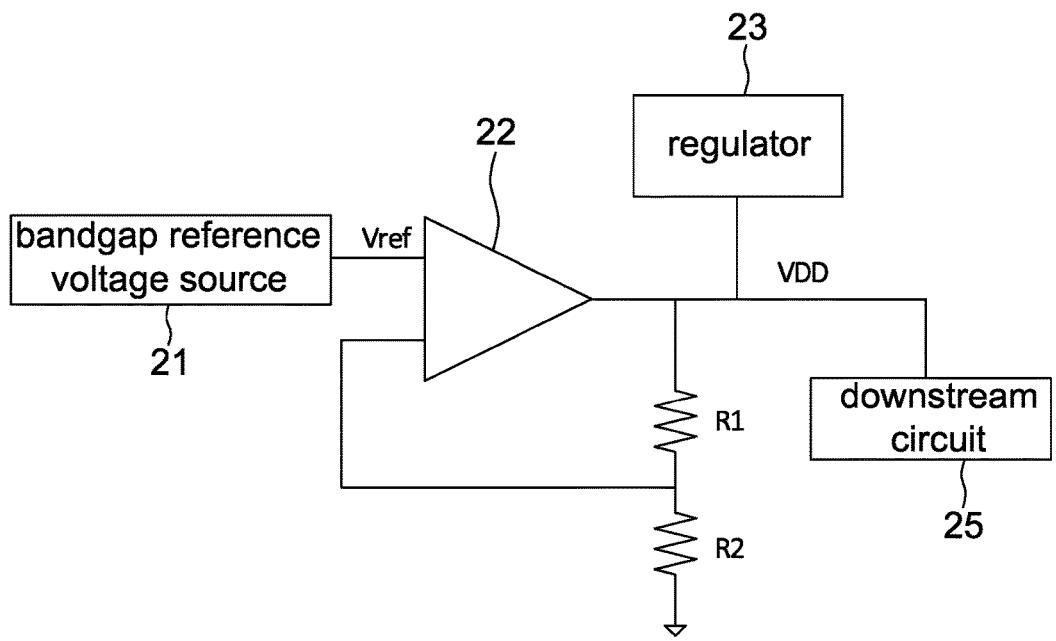
FIG. 2 is a block diagram of another conventional power source circuit.
Figure 3:
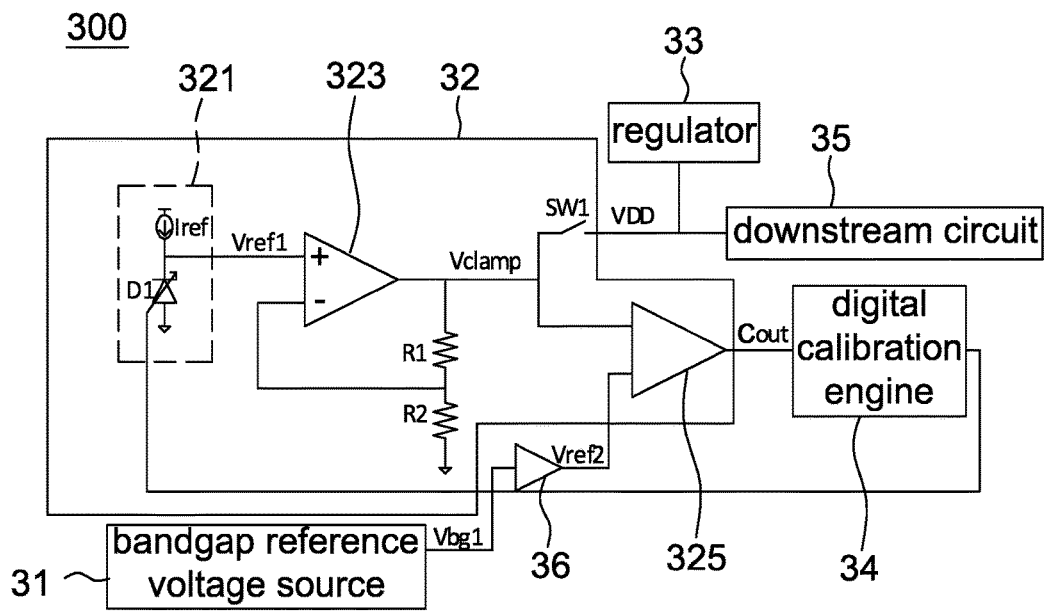
FIG. 3 is a block diagram of a bandgap reference circuit according to one embodiment of the present disclosure.

Referring to FIG. 3, it is a block diagram of a bandgap reference circuit 300 according to one embodiment of the present disclosure. The bandgap reference circuit 300 includes a bandgap reference voltage source 31, a clamp circuit 32, a regulator 33 and a digital calibration engine 34. The bandgap reference circuit 300 is used to provide a source voltage $V_{DD}$ to a downstream circuit 35, wherein the downstream circuit 35 includes, for example, a digital core. The source voltage $V_{DD}$ is, for example, smaller than or equal to 1 volt, but not limited to. If the calibration is performed properly, the source voltage $V_{DD}$ may be set at a lower voltage level.

In the embodiment of the present disclosure, as the calibrated clamp voltage Vclamp outputted by the clamp circuit 32 is almost equal to the desired source voltage $V_{DD}$ and has a small voltage variation, the downstream circuit 35 uses a lower source voltage $V_{DD}$. As the clamp circuit 32 is designed to have low power consumption, the leakage current is reduced by providing the source power $V_{DD}$ only by the clamp circuit 32 in a low power mode (or suspend mode).

The bandgap reference voltage source 31 is used to provide a bandgap voltage Vbg1 not sensitive to the process, voltage and temperature (PVT). The bandgap reference voltage source 31 also provides a reference voltage to other circuits, e.g., the regulator 33. The regulator 33 is coupled between the clamp circuit 32 and the downstream circuit 35, and used to hold the source voltage $V_{DD}$ firmly and not being influenced by loading current within a predetermined range. The regulator 33 may use a proper regulator without particular limitations as long as the used regulator operates in a normal mode and can be shut down in a low power mode.

The clamp circuit 32 includes a reference generator 321, an operational amplifier 323, a comparator 325, an output switch SW1, a feedback resistor R1 and a ground resistor R2, wherein the feedback resistor R1 and the ground resistor R2 are formed by transistors to reduce the circuit area.

Figure 4:
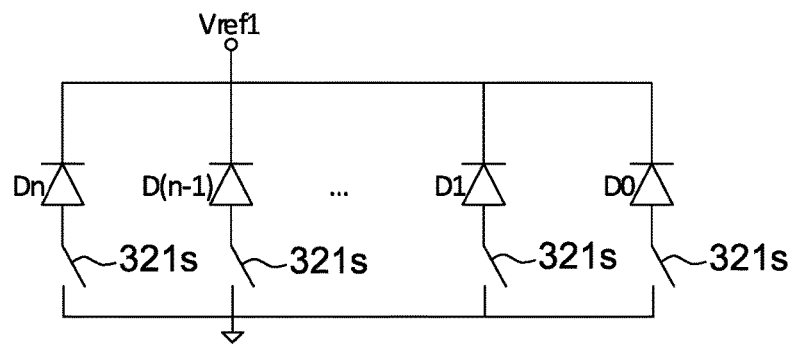
FIG. 4 is a partial circuit diagram of a reference generator of a clamp circuit according to one embodiment of the present disclosure.
Figure 5:
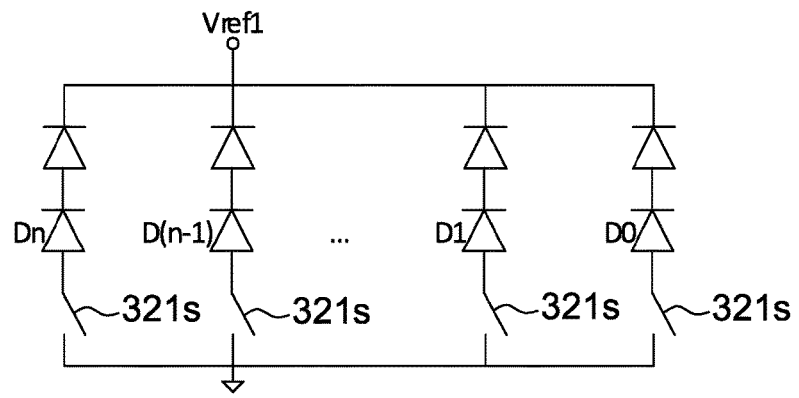
FIG. 5 is a partial circuit diagram of a reference generator of a clamp circuit according to another embodiment of the present disclosure.

The reference generator 321 is used to generate an adjustable first reference voltage Vref1. In one embodiment, the reference generator 321 includes a reference current source and a diode bank D1. The reference current source is used to generate a reference current Iref to the diode bank D1, wherein the reference current Iref is preferably within a nano ampere range (e.g., 200 nA) and provided by a standard constant transconductance (Gm) circuit. The diode bank D1 is shown in FIGS. 4-5 for example, and each of the diodes D0-Dn (e.g., formed by diode connected transistor) or each of the serially connected diode groups D0'-Dn' has different width/length ratio from another and connects to one clamp switch 321s. By controlling different connection states of a plurality of clamp switches 321s, the first reference voltage Vref1 generated by the reference generator 321 is changeable. As each diode path is connected to ground, the diodes are not influenced by the voltage variation. In another embodiment, the reference generator 321 includes a reference current source and a transistor bank. The transistor bank is connected as shown in FIG. 6A, and FIG. 6B is an equivalent circuit of the transistor bank in FIG. 6A. Similarly, by controlling different connection states of a plurality of clamp switches 321s, the first reference voltage Vref1 generated by the reference generator 321 is changeable.

In the above embodiments, the diodes or transistors are used to replace the accurate resistors (e.g., poly resistors) such that the area occupied by the resistive circuit is reduced in the nano ampere range. It should be mentioned that the connections of the diodes, transistors and clamp switches 321s are not limited to those shown in FIGS. 4-6B. Their connection may be properly arranged without particular limitations as long as the first reference voltage Vref1 generated by the reference generator 321 is step-changed by changing the connection state of the clamp switches 321s.

The operational amplifier 323 has a positive input terminal (+), a negative input terminal (−) and an output terminal. The positive input terminal receives the first reference voltage Vref1 generated by the reference generator 321. The output terminal is feedback to the negative input terminal via the feedback resistor R1, and used to output a clamp voltage Vclamp. The ground resistor R2 is connected between the negative input terminal of the operational amplifier 323 and ground (e.g., FIG. 3 showing one end of the ground resistor R2 being connected to the ground and the other end being connected to the feedback resistor R1). The relationship between the clamp voltage Vclamp and the first reference voltage Vref1 is written as equation 1:

$$V\text{clamp} = V\text{ref1} \times (1 + R1/R2) \qquad \text{equation 1}$$

The comparator 325 is used to compare the clamp voltage Vclamp with a second reference voltage Vref2 to generate a comparing output Cout, wherein the second reference voltage Vref2 is associated with the bandgap voltage Vbg1. In this embodiment, said second reference voltage Vref2 associated with the bandgap voltage Vbg1 is referred to that the second reference voltage Vref2 is equal to the bandgap voltage Vbg1 or the second reference voltage Vref2 is generated by an analog buffer 36, which is included in the bandgap reference circuit 300, from the bandgap voltage Vbg1. In other words, the bandgap reference circuit 300 of this embodiment may or may not include the analog buffer 36 according to the bandgap voltage Vbg1 provided by the bandgap reference voltage source 31 and the source voltage $V_{DD}$ to be provided.

In this embodiment, as the clamp voltage Vclamp is calibrated to be close to or equal to the second reference voltage Vref2 associated with the bandgap voltage Vbg1, which is not sensitive to PVT, the offset caused by the process and voltage variation is diminished. For example, although the reference current Iref and the diode bank D1 are still sensitive to the process and voltage variation, by adopting the calibration in the present disclosure, the variation thereof is removed. As for the variation caused by the temperature, it is very tiny compared with the offset due to the process.

The output switch SW1 is connected to the output terminal of the operational amplifier 323 and used to control the outputting of the clamp voltage Vclamp. That is, when the output switch SW1 is conducted, the clamp voltage Vclamp is outputted as the source voltage $V_{DD}$ to be provided to the downstream circuit 35; when the output switch SW1 is not conducted, the clamp voltage Vclamp is only compared with the second reference voltage Vref2 without being outputted. The output switch SW1, for example, receives a control signal from the downstream circuit 35 to be conducted in the low power mode but not conducted in other modes. The regulator 33 is coupled between the output switch SW1 and the downstream circuit 35.

The digital calibration engine 34 is used to adjust the first reference voltage Vref1 generated by the reference generator 321 according to the comparing output Cout to cause the clamp voltage Vclamp to have a smallest difference with respect to or be equal to the second reference voltage Vref2 (or the bandgap voltage Vbg1 when the analog buffer 36 is not implemented). The digital calibration engine 34 is, for example, a digital signal processor (DSP).

For example, in the embodiments of FIGS. 4-5, the digital calibration engine 34 changes the connection of the diode bank D1 by controlling the ON/OFF of the plurality of clamp switches 321s to adjust the first reference voltage Vref1 generated by the reference generator 321. In the embodiment of FIG. 6A, the digital calibration engine 34 changes the connection of the transistor bank by controlling the ON/OFF of the plurality of clamp switches 321s to adjust the first reference voltage Vref1 generated by the reference generator 321.

Figure 7:
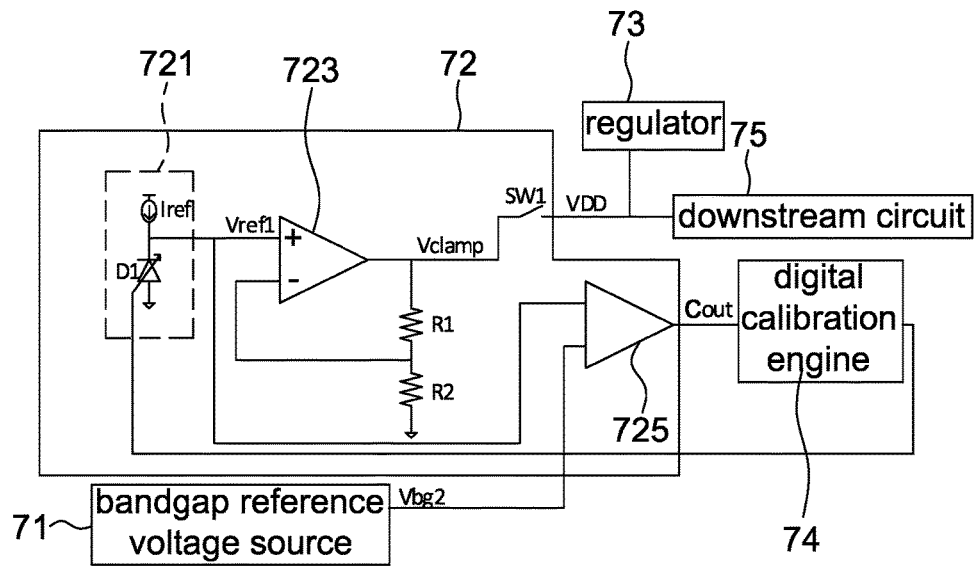
FIG. 7 is a block diagram of a bandgap reference circuit according to another embodiment of the present disclosure.

Referring to FIG. 7, it is a block diagram of a bandgap reference circuit 700 according to another embodiment of the present disclosure. The difference between the bandgap reference circuit 700 in FIG. 7 and the bandgap reference circuit 300 in FIG. 3 is at the voltages compared by the comparators 325 and 725. Functions of the bandgap reference voltage source 71, regulator 73, reference generator 721, operational amplifier 721, output switch SW1, feedback resistor R1 and ground resistor R2 are similar to the bandgap reference voltage source 31, regulator 33, reference generator 321, operational amplifier 321, output switch SW1, feedback resistor R1 and ground resistor R2 in FIG. 3, and are appreciated by one of ordinary skill in the art according to the descriptions of FIG. 3.

More specifically in FIG. 7, the comparator 725 is used to compare the first reference voltage Vref1 and a second reference voltage to output a comparing output Cout. In this embodiment, the second reference voltage is shown to be directly equal to the bandgap voltage Vbg2 outputted by the bandgap reference voltage source 71. As described in the above embodiment, FIG. 7 may further include an analog buffer (e.g., the element 36 in FIG. 3) used to convert the bandgap voltage Vbg2 to a different second reference voltage depending on a desired value of the source voltage $V_{DD}$. The digital calibration engine 74 is used to adjust the first reference voltage Vref1 generated by the reference generator 721 according to the comparing output Cout to cause the first reference voltage Vref1 to have a smallest difference with respect to or be equal to the second reference voltage (e.g., the bandgap voltage Vbg2). The method of adjusting the first reference voltage Vref1 is referred to FIGS. 3 to 6B.

If it is assumed that the source voltages $V_{DD}$ in FIGS. 3 and 7 are identical, FIG. 3 does not include the analog buffer 36, and the operational amplifiers 323 and 723 are ideal, the bandgap voltage Vbg2 is selected as Vbg1/(1+R1/R2).

Figure 8:
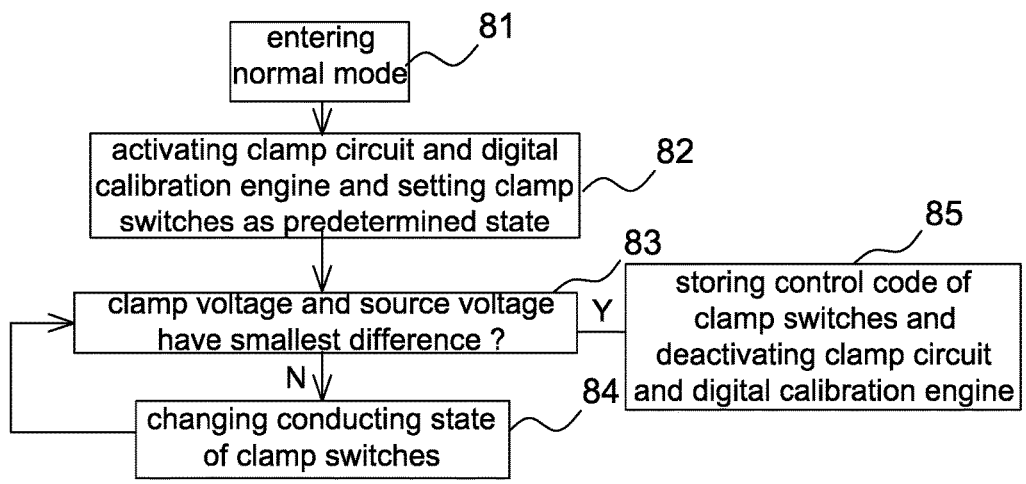
FIG. 8 is a flow chart of an operating method of a bandgap reference circuit according to one embodiment of the present disclosure.

Referring to FIG. 8, it is a flow chart of an operating method of a bandgap reference circuit according to one embodiment of the present disclosure, and the operating method is adaptable to the bandgap reference circuits 300 and 700 of FIGS. 3 and 7 (e.g., the bandgap reference circuit 300 in FIG. 3 being taken as an example for illustration hereinafter). As mentioned above, the bandgap reference circuit 300 includes a clamp circuit 32, a bandgap reference voltage source 31, a regulator 33 and a digital calibration engine 34. The clamp circuit 32 includes a plurality of clamp switches (e.g., clamp switches 321s in FIGS. 4-6B) for controlling a clamp voltage Vclamp outputted by the clamp circuit 32.

The operating method of this embodiment includes a normal mode, a calibration mode and a low power mode, wherein said normal mode is referred to that the power required by the downstream circuit 35 is provided by the bandgap reference voltage source 31 and the regulator 33 instead of by the clamp circuit 32; in said calibration mode, the power required by the downstream circuit 35 is still provided by the bandgap reference voltage source 31 and the regulator 33 only the digital calibration engine 34 stores the control code for controlling the reference generator 321; and said low power mode is referred to that the power required by the downstream circuit 35 is provided by the clamp circuit 32 instead of by the bandgap reference voltage source 31 and the regulator 33. Accordingly, in the low power mode, the bandgap reference circuit 300 consumes lower power than the conventional power source circuits.

The operating method of this embodiment includes the steps of: entering a normal mode, in which a clamp circuit is shut down and a digital calibration engine is idle (Step S81); entering a calibration mode, in which the clamp circuit and the digital calibration engine are activated, and a plurality of clamp switches are arranged as a predetermined conducting state (Step S82); in the calibration mode, adjusting, using the digital calibration engine, a conducting state of the plurality of clamp switches to obtain a smallest difference between the clamp voltage and a predetermined source voltage, (Step S83-84); storing, in the digital calibration engine, a control code of the plurality of clamp switches corresponding to the smallest difference, and deactivating the clamp circuit and idling the digital calibration engine to return to the normal mode (Step S85). In other words, the operating method of this embodiment enters the calibration mode once from the normal mode, and returns to the normal mode after the calibration mode is ended. Said one-time calibration is referred to that the digital calibration engine controls the plurality of clamp switches for one time to obtain the smallest difference or controls the plurality of clamp switches in a step-by-step manner for several times to obtain the smallest difference depending on actual operations. The digital calibration engine 34 controls the clamp switches in any suitable way as long as the smallest difference is obtainable.

In other embodiments, in facing the quick environmental change or long-term operation, said calibration mode is entered automatically every predetermined period of time. For example, the calibration mode is entered after the startup procedure accomplishes and the normal mode is entered after the calibration. Then the calibration mode is entered again every 30 or 60 minutes, but not limited thereto. Every time entering the calibration mode, the clamp switches are controlled to obtain a smallest difference between the clamp voltage and a predetermined source voltage. It is possible that values of the smallest difference obtained in the calibration modes entered at different times are different from each other due to different switching states of the clamp switches.

Referring to FIGS. 3 and 8-9 together, details of the operating method of this embodiment are described hereinafter.

Step S81: After the system is turned on, the bandgap reference circuit 300, for example, directly enters a normal mode to provide a source voltage $V_{DD}$ required by the downstream circuit 35. As shown in FIG. 9, in the normal mode, as the power required in the operation of the downstream circuit 35 is provided by the bandgap reference voltage source 31 and the regulator 33, the bandgap reference voltage source 31 and the regulator 33 are turned on; whereas, the clamp circuit 32 is shut down and the output switch SW1 is not conducted. The digital calibration engine 34 is in an idle state (i.e., only consuming leakage current) to hold the stored control code.

Step S82: In the normal mode, a calibration mode may be entered, e.g., receiving a control signal from the downstream circuit 35, automatically entered after the start-up, automatically entered every predetermined time interval (e.g., counted by a counter) or automatically entered every time a low power mode being ended. After entering the calibration mode, the reference generator 321, the operational amplifier 323 and the comparator 325 are powered up in order to operate. Then, the reference generator 321 starts to generate the reference current Iref and a plurality of clamp switches 321s therein is set at a predetermined conducting state. For example, the predetermined conducting state is set to cause the first reference voltage Vref1 outputted by the reference generator 321 to have a smallest value, a largest value, a middle value or other values among generable voltage values.

Step S83: The operational amplifier 323 amplifies the first reference voltage Vref1 to the clamp voltage Vclamp. The comparator 325 compares the clamp voltage Vclamp with the second reference voltage Vref2 (i.e. the voltage to be provided to the downstream circuit 35) to generate a comparing output Cout. The digital calibration engine 34 identifies whether the difference between the clamp voltage Vclamp and the second reference voltage Vref2 is smallest or not according to the comparing output Cout. If yes, the step S85 is entered; if not, the step S84 is entered. In other words, when the clamp voltage Vclamp and the second reference voltage Vref2 have a smallest difference therebetween, the clamp voltage Vclamp is closest to a predetermined source voltage $V_{DD}$ and has a smallest difference with respect to the predetermined source voltage $V_{DD}$.

Step S84: Then, the digital calibration engine 34 generates digital signals (e.g., 4 bits, 8 bits . . . ) to control the ON/OFF of the plurality of clamp switches 321s of the clamp circuit 321 to output different first reference voltages Vref1 (e.g., gradually increasing or decreasing the first reference voltage Vref1). Each connection state of the plurality of clamp switches 321s corresponds to one first reference voltage Vref1. The operational amplifier 323 amplifies the first reference voltage Vref1 to the clamp voltage Vclamp. When changing the connection of the plurality of clamp switches 321s, the digital calibration engine 34 identifies whether the clamp voltage Vclamp gradually approaches the second reference voltage Vref2 according to the comparing output Cout of the comparator 325. If the smallest difference is not reached, the steps S83 and S84 are repeatedly performed, and the step S85 is entered till the smallest difference is obtained.

Step S85: When a smallest difference is identified according to the comparing output Cout, the digital calibration engine 34 records the control code (e.g., digital code) at the same time, and sends a control signal to make the bandgap reference circuit 300 return to the normal mode. When the smallest difference is identified, the clamp circuit is deactivated and the digital calibration engine is idled to return to the normal mode.

As the clamp circuit 32 is not used to provide the source voltage $V_{DD}$ in both the normal mode and the calibration mode, the output switch SW1 is not conducted in both the normal mode and the calibration mode.

In the calibration mode, as the clamp circuit 32 and the digital calibration engine 34 are operated to store the control code, the clamp circuit 32 and the digital calibration engine 34 are turned on. Meanwhile, as the bandgap reference voltage source 31 and the regulator 33 still provides the source voltage $V_{DD}$, the bandgap reference voltage source 31 and the regulator 33 are turned on.

The operating method of this embodiment further includes the step of: entering a low power mode (e.g., an electronic device adopting the bandgap reference circuit 300 entering a sleep mode), in which as the clamp circuit 32 is used to provide the source voltage $V_{DD}$, the clamp circuit 32 is turned on and the output switch SW1 is conducted to output the clamp voltage Vclamp as the source voltage $V_{DD}$. Meanwhile, the digital calibration engine 34 controls the reference generator 321 using the control code stored in the calibration mode. The bandgap reference voltage source 31 and the regulator 33 are shut down to reduce the system power consumption in the low power mode.

When the above operating method is adapted to the bandgap reference circuit 700 in FIG. 7, the digital calibration engine 74 identifies whether a difference between the first reference voltage Vref1 and the second reference voltage (e.g., bandgap voltage Vbg2) reaches a smallest value, and records the control code of the plurality of clamp switches 321s corresponding to the smallest difference. In other words, when the difference between the first reference voltage Vref1 and the second reference voltage is smallest, the clamp voltage Vclamp is closest to a predetermined source voltage $V_{DD}$ and has a smallest difference value with respect to the predetermined source voltage $V_{DD}$. Details of other parts are similar to the above descriptions and thus not repeated herein.

In addition, it is possible to adjust the first reference voltage Vref1 generated by the reference generator 321 in other ways. For example referring to FIGS. 10-11, FIG. 10 is a block diagram of a bandgap reference circuit 300' according to an alternative embodiment of the present disclosure. The difference between the bandgap reference circuit 300' in FIG. 10 and the bandgap reference circuit 300 in FIG. 3 is at the way of changing the first reference voltage Vref1. In FIG. 3, a plurality of clamp switches 321s is used to change the connection of a plurality of diodes; whereas in FIG. 11, a plurality of clamp switches 321s is used to change the connection of a plurality of reference current sources iref0 to iref(n) so as to change the first reference voltage Vref1 generated by the reference generator 321', wherein iref0 to iref(n) respectively have different reference current values. In FIG. 10, the diode D1 is an unchanged diode. Functions of other elements in FIG. 10 and the operating method of FIG. 10 are similar to those of FIGS. 3 and 8 only a circuit structure of the reference generator 321' is changed. That is, these embodiments all adjust the generated first reference voltage Vref1 according to different connection states of a plurality of clamp switches 321s, and thus identical parts are not repeated herein.

More specifically, the clamp switches 321s of the clamp circuit 321 are used to control the connection of a diode bank (as FIGS. 4-5), a transistor bank (as FIGS. 6A-6B) or a current source bank (as FIG. 11).

In the operating method of the present disclosure, when the output switch SW1 is conducted, it means that a low power mode is entered, and thus the clamp circuit is turned on but the bandgap reference voltage source and the regulator are shut down. When the output switch SW1 is not conducted, it is possible that the normal mode or the calibration mode is entered; the bandgap reference voltage source and the regulator are turned on in both modes to provide source voltage $V_{DD}$ to the downstream circuit, and the clamp circuit is shut down in the normal mode but activated in the calibration mode. That is, the clamp circuit is turned only in the calibration mode but shut down in other time interval of the normal mode. The purpose of activating the clamp circuit is to allow the digital calibration engine to be able to store a control code for controlling the ON/OFF of the plurality of clamp switches 321s in the reference generator.

As mentioned above, as a bandgap reference voltage source of the conventional power source circuit still provides a stable source voltage in a low power mode, the power source circuit consumes significant power in the low power mode. Therefore, the present disclosure further provides a bandgap reference circuit (FIGS. 3, 7 and 10) and an operating method thereof (FIG. 8) that perform so called one-time calibration in the normal mode to store a control code of a plurality of clamp switches, and provides the source voltage only using a clamp circuit and shuts down the bandgap reference voltage source and the regulator in a low power mode to effectively reduce the total power consumption of the bandgap reference circuit.

Figure 12:
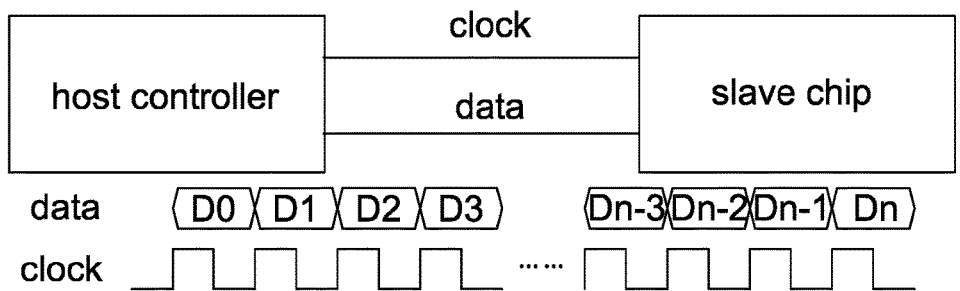
FIG. 12 shows communication between a host controller and a slave chip.

The bandgap reference circuit in the above embodiments is adaptable to a sensing device. The sensing device is used as a sensor chip, for example, for a mouse device, a touchpad or a capacitive touch device. The sensor chip is used as, for example, a slave chip which communicates with a host controller via a clock signal and data as shown in FIG. 12. The host controller and the sensor chip perform the communication using, for example, an I2C, an SPI, an SMBUS or other serial or parallel communication protocols.

When there is no input/output (I/O) activity occurring for a predetermined time interval, the host controller introduces the sensor chip to enter a suspend mode (or referred as a low power mode) to reduce the power consumption. However, when the sensor chip is informed to return to a normal mode from the suspend mode, the host controller usually has to wait for a period of time (e.g., referred as wakeup time) after sending a wakeup command to the sensor chip to wait for the bandgap reference voltage source to wake up. Especially a longer wakeup time is required when the bandgap reference voltage source has a small current and large capacitance.

In some embodiments, when the sensor chip is required to support fast read/write events, e.g., reading/writing digital data using burst mode, the sensor chip has to provide an instant response without a wakeup time. In this scenario, the wakeup time will be an issue.

In some embodiments, the host controller wakes up only a part of the sensor chip (e.g., digital part) to support some events, e.g., updating the sensor status, without powering on the whole sensor chip. This scenario is referred as light current event.

As mentioned above, in the suspend mode, the source voltage $V_{DD}$ is provided by the clamp circuit. However, due to its small current and small circuit area design, the clamp circuit is not suitable to support heavy current events, e.g., continuously supporting burst mode read/write. In addition, the sensor chip will not clearly know whether the host controller is going to perform the full wakeup, status update or burst mode read/write without decoding the command or data from the host controller. If the power is only supported by the clamp circuit without waking up the regulator, a clamp voltage clamped by the clamp circuit can slowly decay with the operating time, wherein the decay rate depends on the capacitance of the clamp circuit (on-chip capacitor generally very small). For example, when the reading/writing time of the burst mode extends long (e.g., the memory is large), it is possible that the clamp voltage reduces to a level lower than a minimum voltage value capable of maintaining the digital and memory state such that problems can be caused.

Accordingly, the present disclosure further provides a bandgap reference circuit and a sensor chip using the same that switch quickly from a suspend mode (i.e. a mode powered by the clamp circuit, and the bandgap reference voltage source and the regulator being powered off) to a LDO mode (i.e. powered by the regulator, and the bandgap reference voltage source not being woken up yet), that quickly support heavy current events without a long wakeup time, that respond real-timely without decoding the command or data from the host controller at first, and that support heavy current events for a longer time. In addition, if a full wakeup is confirmed after the decoding (performed after entering the LDO mode), the bandgap reference voltage source is awoken after the wakeup time. The present disclosure has a large operating flexibility.

Figure 13:
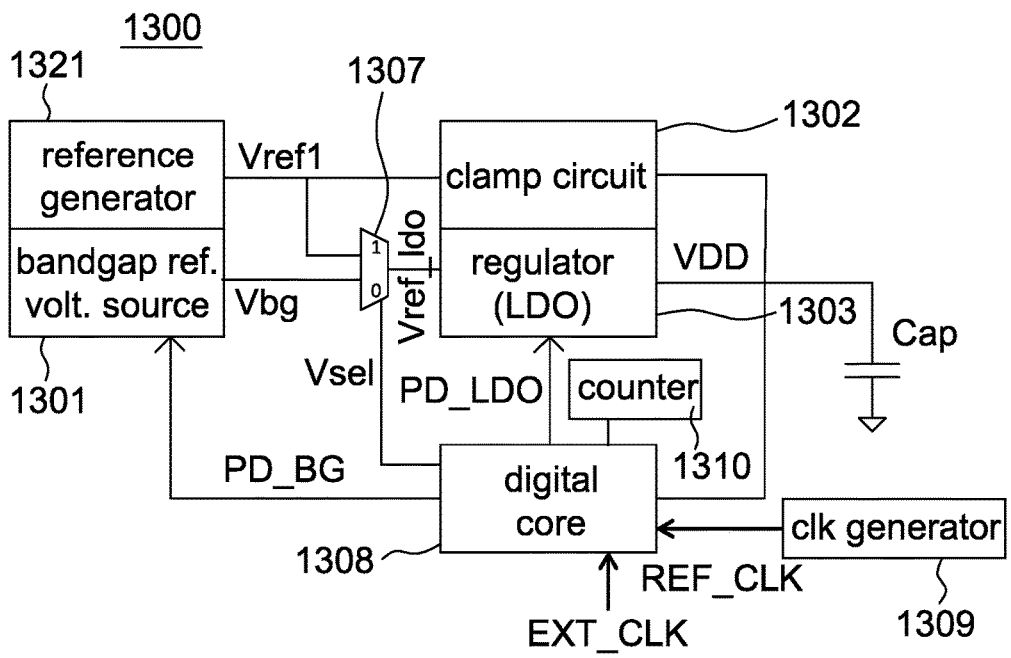
FIG. 13 is a block diagram of a bandgap reference circuit according to another embodiment of the present disclosure.

Referring to FIG. 13, it is a block diagram of a bandgap reference circuit 1300 according to another embodiment of the present disclosure. The bandgap reference circuit 1300 is applicable and included in, for example, a sensor chip (slave chip) shown in FIG. 12 to communicate with an external host controller. The bandgap reference circuit 1300 saves more power in a suspend mode (or referred to a low power mode) and switches to the regulator to enter a LDO (low dropout) mode to provide a source voltage $V_{DD}$ without decoding at first before entering the LDO mode (described by an example below). Meanwhile, after the communication event is over, the regulator is turned off to return to the suspend mode. More specifically, the regulator is not necessary to be powered on when there is no communication event.

The bandgap reference circuit 1300 includes a reference generator 1321, a bandgap reference voltage source 1301, a clamp circuit 1302, a regulator 1303, a switching element 1307, a digital core 1308, a clock generator 1309 and a counter 1310, wherein the counter 1310 may not be implemented according to different applications.

As mentioned above, the bandgap reference voltage source 1301 is used to provide a bandgap voltage Vbg in a normal mode. The bandgap reference voltage source 1301 is implementable by, for example, the bandgap reference voltage source 31 in FIG. 3 or the bandgap reference voltage source 71 in FIG. 7; and the bandgap voltage Vbg is implementable by, for example, the bandgap voltage Vbg1 or Vbg2 in FIG. 3 or FIG. 7. In this embodiment, the bandgap reference voltage source 1301 is powered off in both the suspend mode and the LDO mode for reducing the total power consumption.

In this embodiment, the LDO mode is considered as an intervening mode between the suspend mode and the normal mode or considered as a part of the suspend mode. It is possible that the bandgap reference circuit 1300 returns to the suspend mode from the LDO mode or enters a normal mode from the LDO mode. For example, the suspend mode is returned when the communication events are over, and the normal mode is entered when the full wakeup (e.g., according to the decoding result) is required.

The reference generator 1321 is used to provide the reference voltage Vref1. The reference generator 1321 is implementable, for example, by the reference generator 321 of FIG. 3, by the reference generator 721 of FIG. 7 or by the reference generator 321' of FIG. 10; and the reference voltage Vref1 is implementable by, for example, the reference voltage Vref1 in FIG. 3, 7 or 10. In this embodiment, the reference voltage Vref1 is calibrated to be similar to or identical to the bandgap voltage Vbg in the normal mode or at background, and one method of the calibration has been described above (e.g., referring to FIG. 8) and thus details thereof are not repeated herein. In the present disclosure, the reference voltage Vref1 is PVT (process, voltage and temperature) sensitive; while the bandgap voltage Vbg is PVT insensitive.

The clamp circuit 1302 is electrically coupled to the reference generator 1321, and used to receive the reference voltage Vref1 in the suspend mode to hold the source voltage $V_{DD}$. As mentioned above, the source voltage $V_{DD}$ is used to provide the power required by the downstream circuit (e.g., the digital core 1308). The "Cap" shown in FIG. 13 indicates an external component or an on-chip capacitor. In one embodiment, the clamp circuit 1302 includes, for example, the components 323, R1 and R2 shown in FIG. 3, but not limited thereto.

If the embodiment in FIG. 13 has the function of calibrating the reference voltage Vref1 as the embodiment does in FIG. 3, the bandgap reference circuit 1300 further includes a comparator 325, an output switch SW1 and a digital calibration engine 34, and the details thereof have been described above and thus details thereof are not repeated herein.

The regulator 1303 is used to provide the source voltage $V_{DD}$ in the normal mode and the LDO mode. The regulator 1303 is implementable by, for example, the regulator 33 in FIG. 3 or the regulator 73 in FIG. 7. The regulator 1303 has larger MOS switches than the clamp circuit 1302.

The switching element 1307 is coupled between the reference generator 1321, the bandgap reference voltage source 1301 and the regulator 1303, and used to switch, under the control of the digital core 1308, the voltage to be inputted into the regulator 1303, i.e. the Vref_ldo being selected as the bandgap voltage Vbg or the reference voltage Vref1. For example, FIG. 13 shows that the switching element 1307 is a multiplexer, but not limited thereto, as long as it is a component capable of selecting one of the bandgap voltage Vbg and the reference voltage Vref1 to be provided to the regulator 1303. The regulator 1303 generates the source voltage $V_{DD}$ based on the input of the reference voltage Vref1 or the bandgap voltage Vbg.

The digital core 1308 includes, for example, a digital signal processor (DSP), an application specific integrated circuit (ASIC) or a microcontroller unit (MCU). In this embodiment, the digital core 1308 is used to control, according to the packet data and clock signal from an external host controller, the ON/OFF of the regulator 1303, the ON/OFF of the bandgap reference voltage source 1301, the counting and reset of the counter 1310, and the switching function of the switching element 1307, and digital core 1308 has a memory for storing digital data. In one embodiment, the host controller and the sensor chip perform the communication using an I2C, an SPI or an SMBUS communication protocol, FIG. 12 shows that the communication includes the transmission of the clock signal and the packet data (e.g., including D0 to Dn).

The clock generator 1309 is used to generate a reference clock signal REF_CLK to be used by the sensor chip in the suspend mode. Preferably, the clock generator 1309 generates a main clock signal in the normal mode and generates the reference clock signal REF_CLK in the suspend mode. The frequency of the main clock signal is preferably much larger than that of the reference clock signal REF_CLK. Preferably, the period of the reference clock signal REF_CLK is longer than the length of packet data sent from the host controller. The counter 1310 is used to count one of rising edges or falling edges of the reference clock signal REF_CLK (e.g., the counting number being added by 1 each time a rising edge or a falling edge being detected), and the counting number of the counter 1310 is reset to 0 by the digital core 1308 (described by an example below).

Please referring to FIGS. 13 and 20, the operating states in the normal mode and the suspend mode of the present disclosure are described hereinafter.

In the normal mode, the digital core 1308 controls the bandgap reference voltage source 1301 and the regulator 1303 to turn on. The switching element 1307 connects (e.g., conducting the node 0 of a multiplexer) the bandgap voltage Vbg of the bandgap reference voltage source 1301 to the regulator 1303 to generate the source voltage $V_{DD}$. Meanwhile, the reference generator 1321 is turned off and does not provide the reference voltage Vref1. The clamp circuit 1302 is also turned off. The reference generator 1321 and the clamp circuit 1302 are turned off by, for example, bypassing with a switching element or not providing power thereto.

When the sensor chip (or the digital core 1308) does not receive any communication event, e.g., not receiving any clock signal or packet data from the host controller, over a predetermined time interval, the suspend mode is entered. As mentioned above, in order to reduce the power consumption in the suspend mode as much as possible, the bandgap reference voltage source 1301 and the regulator 1303 are both turned off and the reference generator 1321 and the clamp circuit 1302 are both turned on in the suspend mode. For example, the digital core 1308 turns off the bandgap reference voltage source 1301 via a signal PD_BG, and turns off the regulator 1303 via a signal PD_LDO. In addition, the digital core 1308 switches the connection (e.g., conducting the node 1 of a multiplexer) of the switching element 1307 via a signal Vsel, and controls the switching element 1307 to connect the reference voltage Vref1 to the regulator 1303. In this way, the regulator 1303 is turned on anytime to provide the source voltage $V_{DD}$ without waiting the long wakeup time of the bandgap reference voltage source 1301.

Figure 14A:
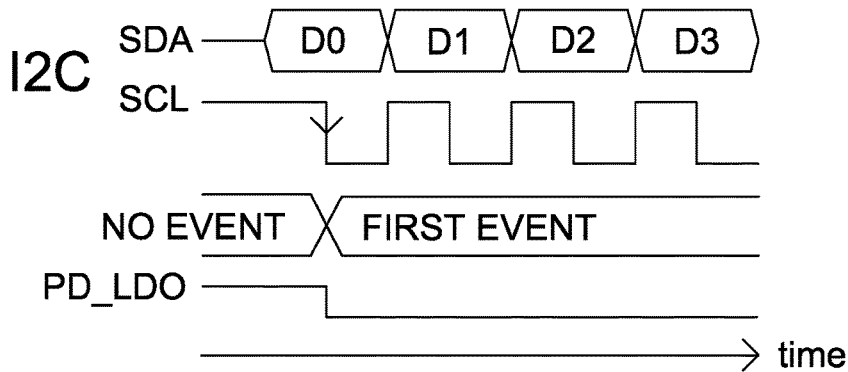
FIG. 14A is a timing diagram of the regulator control using an I2C communication protocol in the embodiment of the present disclosure.
Figure 14B:
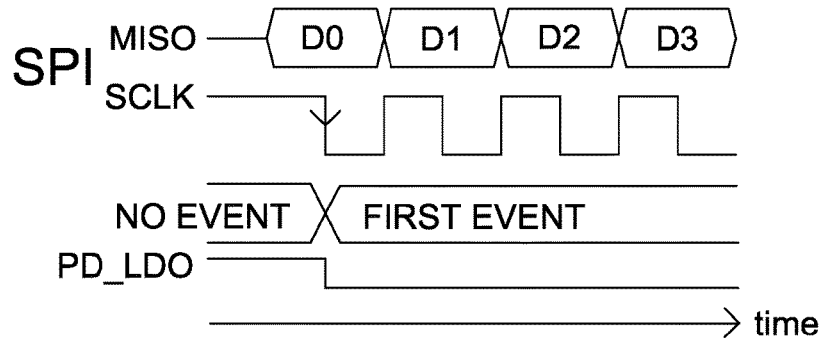
FIG. 14B is a timing diagram of the regulator control using an SPI communication protocol in the embodiment of the present disclosure.

Referring to FIGS. 14A and 14B, the method of entering the LDO mode is described hereinafter. FIG. 14A is a timing diagram of the regulator control using an I2C communication protocol in the embodiment of the present disclosure, and FIG. 14B is a timing diagram of the regulator control using an SPI communication protocol in the embodiment of the present disclosure. As shown in FIGS. 14A and 14B, in the suspend mode, when the digital core 1308 does not receive any communication event (shown as NO EVENT), the regulator 1303 is turned off (i.e. maintaining the suspend mode), e.g., a high level of the signal PD_LDO indicating power down the regulator 1303, while a low level of the signal PD_LDO indicating power on the regulator 1303; or vice versa. Said not receiving any communication event herein is referred to that there is no level change (rising edge or falling edge) in the external clock signal EXT_CLK (e.g., SCL in FIG. 14A or SCLK in FIG. 14B). When the digital core 1308 receives a communication event (e.g., the external clock signal EXT_CLK in FIGS. 14A and 14B having a falling edge), the LDO mode is entered. In the LDO mode, the digital core 1308 turns on, via the signal PD_LDO, the regulator 1303 to generate the source voltage $V_{DD}$. As mentioned above, the switching element 1307 has already connected the reference voltage Vref1 to the regulator 1303 when the low power mode is entered. Accordingly, the regulator 1303 can quickly provide the source voltage $V_{DD}$ based on the reference voltage Vref1 when entering the LDO mode.

In the present disclosure, when the digital core 1308 receives the rising edge or falling edge of the external clock signal EXT-CLK, the external data from the host controller is also received (as shown in FIGS. 14A and 14B). Before entering the LDO mode, the external command or data has not been decoded by the digital core 1308. In other words, once the digital core 1308 receives the I/O activity from the host controller, the regulator 1303 is immediately powered on to provide the source voltage VDD such that even heavy current events (e.g., burst mode read/write) are required, the read/write activity is supported without waiting for the long wakeup time and capable of maintaining for a long interval. In the LDO mode, the regulator 1303 receives the reference voltage Vref1 to provide the source voltage VDD. The clamp circuit 1302 is maintained powered on or powered off in the LDO mode without particular limitations.

Figure 15:
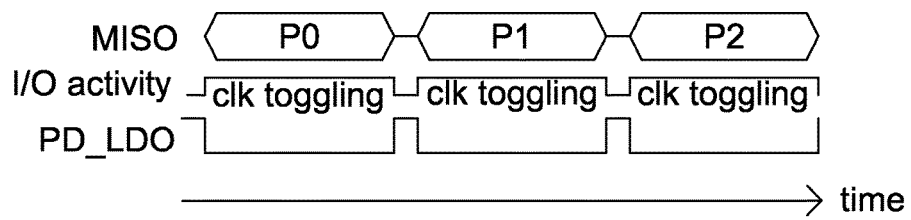
FIG. 15 is a schematic diagram of turning ON/OFF a regulator according to the I/O activity in the embodiment of the present disclosure.

When the I/O activity is over, the sensor chip returns to the suspend mode from the LDO mode. Referring to FIG. 15 for example, when each packet data (e.g., P0, P1 and P2 in FIG. 15) is over, the signal PD_LDO is returned to the high level (corresponding to the rising edge or falling edge of the reference clock signal REF_CLK) to turn off the regulator 1303, i.e. return to the suspend mode. However, in some embodiments, said packet data has a very short transmission period (e.g., 500-600 ns, but not limited thereto) to cause the regulator 1303 to be turned on and off repeatedly. Preferably, this toggling should be avoided.

Figure 16:
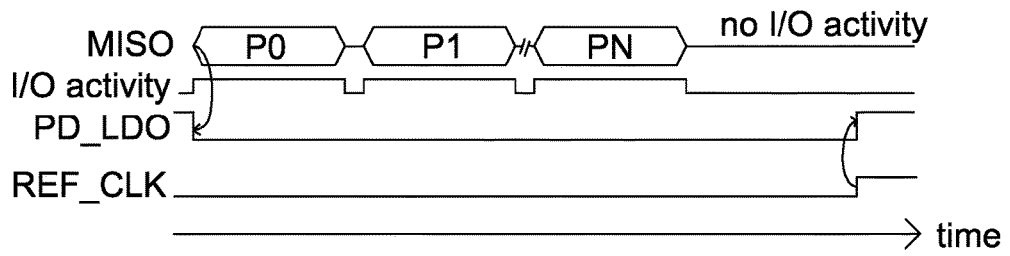
FIG. 16 is a schematic diagram of turning ON/OFF a regulator according to the I/O activity and reference clock signal in the embodiment of the present disclosure.

Referring to FIG. 16, it is a schematic diagram of turning ON/OFF a regulator according to the I/O activity and reference clock signal in the embodiment of the present disclosure. In this embodiment, the reference clock signal REF_CLK generated by the clock generator 1309 in the sensor chip is used as a reference for determining whether the regulator 1303 is turned off in the LDO mode. For example, after the regulator 1303 is turned on (e.g., at the start of the packet data P0) to enter the LDO mode, and when the communication event is over (e.g., no I/O activity interval during which the external clock signal EXT_CLK does not have a rising edge or falling edge) and the reference clock signal REF_CLK has a level change (e.g., from high level to low level or from low level to high level), the digital core 1308 turns off the regulator 1303 and returns to the suspend mode. In this embodiment, the period of the reference clock signal REF_CLK is longer than the interval of the packet data (e.g., the intervals of P0 to PN shown in FIG. 16) so as to effectively use the level change of the reference clock signal REF_CLK to avoid the repeatedly turning on/off of the regulator 1303.

Figure 17:
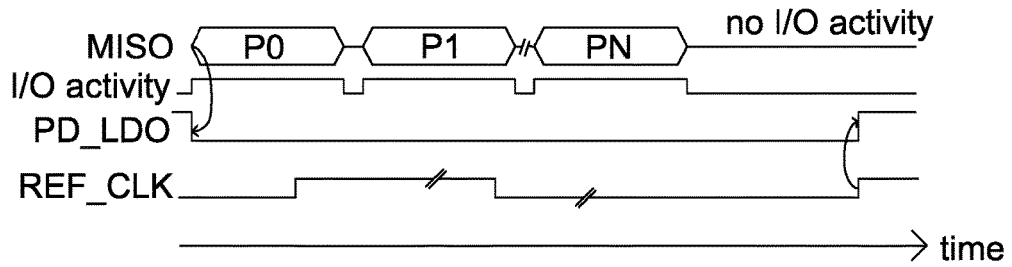
FIG. 17 is another schematic diagram of turning ON/OFF a regulator according to the I/O activity and reference clock signal in the embodiment of the present disclosure.

Referring to FIG. 17, it is another schematic diagram of turning ON/OFF a regulator according to the I/O activity and reference clock signal in the embodiment of the present disclosure. If the communication event is not over (e.g., during P0 to PN), even though the reference clock signal REF_CLK has the level change, the digital core 1308 does not turn off the regulator 1303 (FIG. 17 showing PD_LDO maintaining the low level) until the communication event is over (no I/O activity interval) as well as the reference clock signal REF_CLK has the level change.

Referring to FIG. 18, it is an alternative schematic diagram of turning ON/OFF a regulator according to the I/O activity and reference clock signal in the embodiment of the present disclosure. In some scenarios, if the level change of the reference clock signal REF_CLK happens to occur between two packet periods (e.g., FIG. 18 showing between P0 and P1, but not limited thereto), the regulator 1303 is turned on again within a short time after being turned off. Although this scenario does not occur frequently, the present disclosure further provides a method to avoid this situation by using a counting number of the counter 1310.

Referring to FIG. 19, it is a schematic diagram of turning ON/OFF a regulator according to the I/O activity, reference clock signal and counting number in the embodiment of the present disclosure. After the regulator 1303 is turned on (e.g., at the start of the packet data P0) in the LDO mode, and when the communication event is over (e.g., no I/O activity interval during which the external clock signal EXT_CLK does not have a rising edge or falling edge) and the counting number Cn of the counter 1310 reaches a predetermined number (e.g., 2 or 3 times which is determined according to the period of the reference clock signal REF_CLK; the shorter the period, more times being used, the longer the period, fewer times being used), the digital core 1308 turns off the regulator 1303 and returns to the suspend mode. When the counter 1310 starts to count (e.g., FIG. 19 showing counting the rising edges of the reference clock signal REF_CLK), the digital core 1308 resets the counting number Cn of the counter 1310 to 0 (e.g., FIG. 19 showing the reset being held when receiving the packet data P1) when receiving a new communication event (e.g., new packet data or the corresponding clock signal). Meanwhile, when the counting number Cn of the counter 1310 reaches a predetermined number (e.g., FIG. 19 showing Cn=2), the regulator 1303 is turned off and the counting number Cn of the counter 1310 is reset to 0. In the suspend mode, the counter 1310 is kept being turned off, and the counting is not started until a next LDO mode is entered. Accordingly, it is able to prevent the regulator 1303 from being repeatedly turning on/off.

It should be mentioned that the rising edges and falling edges shown in FIGS. 14A to 19 are only intended to illustrate but not to limit the present disclosure. In other embodiments, the rising edges in FIGS. 14A to 19 are replaced by falling edges, and the falling edges are replaced by rising edges according to different applications. In addition, although FIGS. 15 to 19 take the SPI communication protocol as an example to illustrate, it is not to limit the present disclosure. In other embodiments, the communication is performed by I2C, SMBUS or other protocols. A person skilled in the art would understand how to implement the present disclosure using other communication protocols according to the above illustrations based on SPI communication protocol, and thus details thereof are not repeated herein.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:
1. A sensor chip, comprising:
   a reference generator configured to provide a reference voltage;
   a clamp circuit, electrically coupled to the reference generator, and configured to receive the reference voltage and hold a source voltage;
   a regulator;
   a bandgap reference voltage source configured to provide a bandgap voltage in a normal mode;
   a multiplexer electrically coupled between the reference generator and the regulator; and
   a digital core configured to control the regulator and the multiplexer, wherein
   in a suspend mode, the digital core is configured to control the multiplexer to connect the reference voltage to the regulator, and the regulator is powered off,
   an LDO mode is entered when the digital core receives a rising edge or a falling edge of an external clock signal in the suspend mode, and the digital core is configured to power on the regulator to provide the source voltage in the LDO mode, and
   the bandgap reference voltage source is powered off in the suspend mode and the LDO mode.

2. The sensor chip as claimed in claim 1, wherein the regulator has larger power MOS switches than the clamp circuit.

3. The sensor chip as claimed in claim 1, wherein the digital core is further configured to control the multiplexer to connect the bandgap voltage to the regulator to cause the regulator to generate the source voltage in the normal mode.

4. The sensor chip as claimed in claim 3, wherein the reference voltage is PVT sensitive, while the bandgap voltage is PVT insensitive.

5. The sensor chip as claimed in claim 1, wherein the external clock signal is a clock signal of an I2C, an SPI or an SMBUS communication protocol between the sensor chip and an external host controller.

6. The sensor chip as claimed in claim 1, further comprising a clock generator configured to generate a reference clock signal, wherein
in the LDO mode, when the external clock signal does not have the rising edge or the falling edge and the reference clock signal has a level change, the digital core is configured to power off the regulator to return to the suspend mode.

7. The sensor chip as claimed in claim 1, further comprising
a clock generator configured to generate a reference clock signal; and
a counter configured to count rising edges or falling edges of the reference clock signal, wherein
in the LDO mode, when the external clock signal does not have the rising edge or the falling edge and the counter counts to a predetermined number, the digital core is configured to power off the regulator to return to the suspend mode.

8. The sensor chip as claimed in claim 7, wherein the digital core is configured to reset a counting number of the counter to 0 when receiving new packet data.

9. The sensor chip as claimed in claim 1, wherein the digital core is configured to receive external data when receiving the rising edge or the falling edge of the external clock signal, but the digital core does not decode the external data before entering the LDO mode.

10. A sensor chip, comprising:
a reference generator configured to provide a reference voltage;
a bandgap reference voltage source configured to provide a bandgap voltage;
a regulator configured to provide a source voltage;
a switching element coupled between the reference generator, the bandgap reference voltage source and the regulator,
a clock generator configured to generate a reference clock signal;
a counter configured to count rising edges or falling edges of the reference clock signal; and
a digital core configured to control a switching function of the switching element and ON/OFF of the regulator, wherein
in a normal mode, the switching element is controlled to connect the bandgap voltage to the regulator to generate the source voltage, and
in a suspend mode, the switching element is controlled to connect the reference voltage to the regulator, and the bandgap reference voltage source is powered off when the regulator is powered off in the suspend mode, wherein the regulator is powered on to generate the source voltage when the digital core receives a communication event, and when the communication event is over and the counter counts to a predetermined number after the regulator is powered on, the digital core is configured to power off the regulator.

11. The sensor chip as claimed in claim 10, wherein the reference voltage is PVT sensitive, while the bandgap voltage is PVT insensitive.

12. The sensor chip as claimed in claim 10, wherein in the suspend mode
the regulator is powered off when the digital core does not receive the communication event.

13. The sensor chip circuit as claimed in claim 10, wherein the digital core is configured to reset a counting number of the counter to 0 when receiving a new communication event.

14. The sensor chip as claimed in claim 10, further comprising a clamp circuit electrically coupled to the reference generator to receive the reference voltage, and configured to hold the source voltage in the suspend mode.

15. The sensor chip as claimed in claim 14, wherein the clamp circuit is powered on or powered off when the regulator is receiving the reference voltage to provide the source voltage.

16. The sensor chip as claimed in claim 14, wherein the regulator has larger power MOS switches than the clamp circuit.

17. A sensor chip, comprising:
a reference generator configured to provide a reference voltage;
a clamp circuit, electrically coupled to the reference generator, and configured to receive the reference voltage and hold a source voltage;
a regulator;
a multiplexer electrically coupled between the reference generator and the regulator;
a clock generator configured to generate a reference clock signal; and
a digital core configured to control the regulator and the multiplexer, wherein
in a suspend mode, the digital core is configured to control the multiplexer to connect the reference voltage to the regulator, and the regulator is powered off,
an LDO mode is entered when the digital core receives a rising edge or a falling edge of an external clock signal in the suspend mode, and the digital core is configured to power on the regulator to provide the source voltage in the LDO mode, and
in the LDO mode, when the external clock signal does not have the rising edge or the falling edge and the reference clock signal has a level change, the digital core is configured to power off the regulator to return to the suspend mode.

* * * * *